(12) United States Patent
Huang et al.

(10) Patent No.: US 7,903,443 B2
(45) Date of Patent: Mar. 8, 2011

(54) BUTTERFLY MATCH-LINE STRUCTURE AND SEARCH METHOD IMPLEMENTED THEREBY

(75) Inventors: Po-Tsang Huang, Yingge Township, Taipei County (TW); Wei Hwang, La Verne, CA (US); Shu-Wei Chang, Sinjhuang (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 11/675,440

(22) Filed: Feb. 15, 2007

(65) Prior Publication Data
US 2008/0177944 A1     Jul. 24, 2008

(30) Foreign Application Priority Data

Jan. 19, 2007   (TW) .............................. 96102126 A

(51) Int. Cl.
*G11C 15/00* (2006.01)
(52) U.S. Cl. .................. 365/49.1; 365/49.11; 365/49.15; 365/49.16; 365/49.17; 365/49.18
(58) Field of Classification Search ................ 365/49.1, 365/49.11, 49.12, 49.13, 49.15, 49.16, 49.17, 365/49.18, 50; 326/54, 98
See application file for complete search history.

(56) References Cited

U.S. PATENT DOCUMENTS

| | | | | |
|---|---|---|---|---|
| 5,469,378 A | * | 11/1995 | Albon et al. | 365/49.17 |
| 5,621,677 A | * | 4/1997 | Jones | 365/49.17 |
| 6,295,576 B1 | * | 9/2001 | Ogura et al. | 365/49.17 |
| 6,597,596 B2 | * | 7/2003 | Gordon et al. | 365/49.17 |
| 6,791,364 B2 | * | 9/2004 | Alvandpour et al. | 326/98 |
| 6,980,452 B2 | * | 12/2005 | Ogura | 365/49.17 |
| 7,042,748 B2 | * | 5/2006 | Khanna | 365/49.15 |
| 7,196,922 B2 | * | 3/2007 | Lysinger | 365/49.17 |
| 7,358,768 B2 | * | 4/2008 | Hua et al. | 326/54 |

OTHER PUBLICATIONS

Hideyuki Noda, et al, A Cost-Efficient High-Performance Dynamic TCAM With Pipelined Hierarchical Searching and Shift Redundancy Architecture, IEEE Journal of Solid-State Circuits, vol. 40 No. 1, Jan. 2005.

Jinn-Shyan Wang, et al, TCAM for IP-Address Lookup Using Tree-Style And-Type Match Lines and Segmented Search Lines, IEEE International Solid-State Circuits Conference, pp. 166-167, Feb. 2006.

* cited by examiner

*Primary Examiner* — Trong Phan
(74) *Attorney, Agent, or Firm* — Muncy, Geissler, Olds & Lowe, PLLC

(57) ABSTRACT

The present invention discloses a butterfly match-line structure and a search method implemented thereby, wherein the parallelism of the match lines is increased to shorten the search time, and a butterfly-type connection is used to reduce the power consumption and achieve the best energy efficiency. Via the butterfly-type connection, information can be reciprocally transmitted between the parallel match lines, which are independent originally. When a miss case occurs, more succeeding memory cells will not be compared but will be turned off. Thereby, the power consumption is reduced. Further, XOR-based conditional keepers are used to reduce the matching time and the power consumption. Besides, such a circuit is also used to shorten the delay time of the butterfly-type connection.

11 Claims, 7 Drawing Sheets

BUTTERFLY MATCH-LINE STRUCTURE AND SEARCH METHOD IMPLEMENTED THEREBY

BACKGROUND OF THE INVENTION

1. Field of the Invention

The present invention relates to a butterfly match-line structure and a search method implemented thereby, particularly to a butterfly match-line structure and a search method implemented thereby, which applies to a content-addressable memory to perform IP address search in a communication network.

2. Description of the Related Art

Many technologies have been proposed to reduce the power consumption of match lines. Among them, the method of cutting the information transmission of match lines, which can reduce the capacitance and power consumption of match lines, was widely used in the past because it can effective promote energy efficiency.

Further, some technologies parallelize the memory cells of match lines to solve the problem of low speed and achieve the compromise between speed and energy efficiency. The balance between speed and energy efficiency will be more critical in nanometric-scale circuits.

Accordingly, the Inventors are devoted to obtaining the solution of the abovementioned problem and propose a butterfly match-line structure and a search method implemented thereby.

SUMMARY OF THE INVENTION

The primary objective of the present invention is to provide a butterfly match-line structure and a search method implemented thereby, which can reduce the search time and power consumption of match lines at the same time.

Another objective of the present invention is to provide a butterfly match-line structure and a search method implemented thereby, wherein different parallel match lines are linked by a butterfly-type connection; as the control signal is directly obtained from the front stage, not too many logic gates need to be added.

Still another objective of the present invention is to provide a butterfly match-line structure and a search method implemented thereby, which utilizes XOR-based conditional keepers to reduce the delay time of the butterfly-type connection and achieve the best energy efficiency.

Further another objective of the present invention is to provide a butterfly match-line structure and a search method implemented thereby, which utilizes XOR-based conditional keepers to provide a noise-tolerant function for the dynamic circuit and eliminate unnecessary power consumption.

The present invention proposes a butterfly match-line structure and a search method implemented thereby, which apply to a content-addressable memory. In the present invention, a plurality of memory cells is allocated from the content-addressable memory, and hierarchical match lines are used to cascade the memory cells. Each pair of the diagonally neighboring memory cells of different match lines is linked to each other. In such a butterfly match-line structure, the first layer of memory cells is compared against an input signal; if the result is a match case, the next layer of memory cells is compared; if the results are always match cases, comparisons are performed successively until the last layer of memory cells; if a miss case occurs in one layer of memory cells, the comparing operation stops. Therefore, when the result of comparison is a miss case, more succeeding memory cells will not be compared but will be turned off.

The output of each match line is coupled to a XOR-based conditional keeper to reduce the delay time of the butterfly-type connection and achieve the best energy efficiency. The XOR-based conditional keeper can also provide a noise-tolerant function for the dynamic circuit and eliminate unnecessary power consumption.

The present invention utilizes a butterfly-type connection to link different parallel match lines. As the control signal is directly obtained from the front stage, not too many logic gates need to be added. Thus, the present invention can reduce the search time and power consumption of the match lines at the same time.

To enable the objectives, technical contents, characteristics and accomplishments of the present invention to be easily understood, the embodiments of the present invention are to be described in detail in cooperation with the attached drawings below.

DETAILED DESCRIPTION OF THE INVENTION

With the development of IP v.6, how to search with less power consumption without the penalty of search speed has becomes the focus of designing a content-addressable memory. The present invention is to realize such a design idea. The butterfly match-line structure and the search method implemented thereby proposed by the present invention pertains to a novel butterfly match-line structure to reduce the search time and the power consumption at the same time. The present invention mainly applies to the network-related products, which use a content-addressable memory to perform IP address search in a communication network, such as a router.

Several embodiments are used to exemplify the present invention in detail below. These embodiments are mainly different in the partition methods of match lines and memory cells and in the butterfly-type connection methods.

Figure 1:
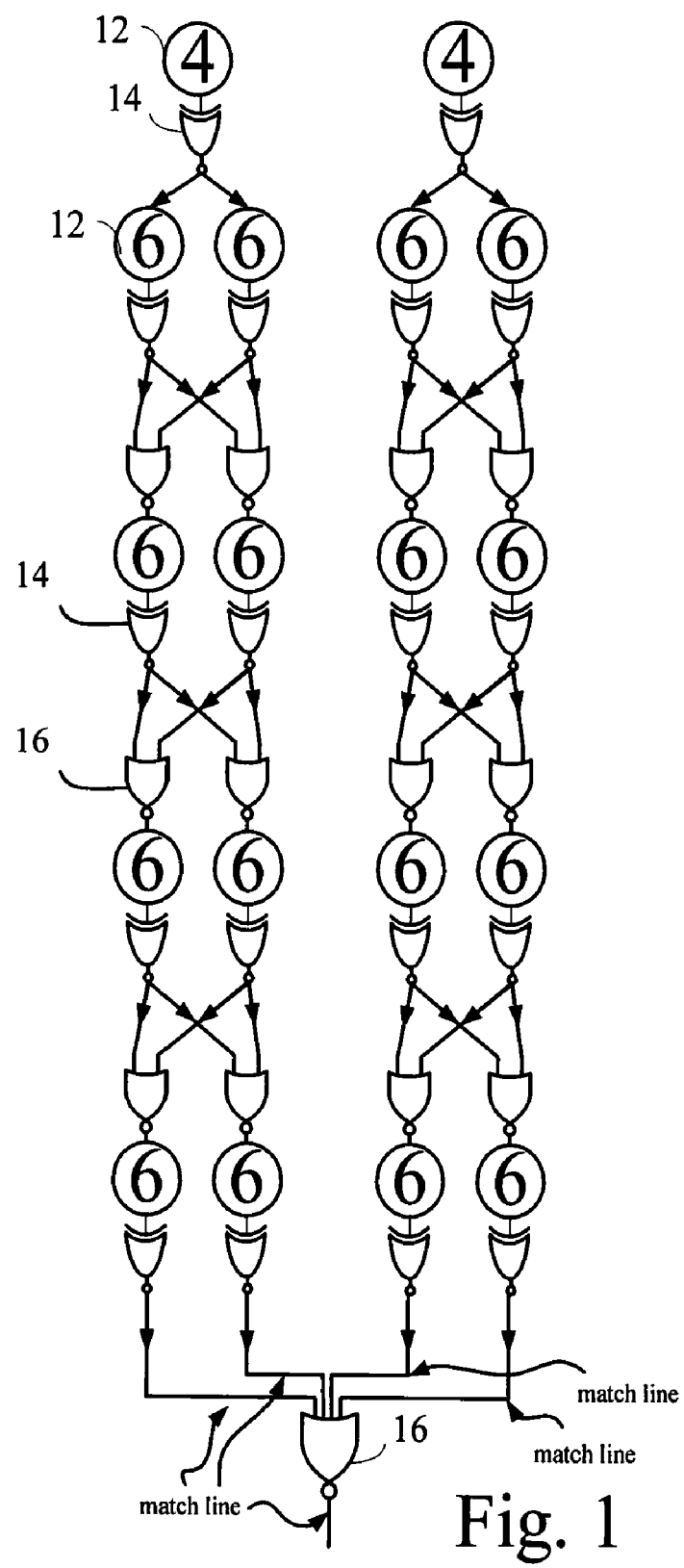
FIG. 1 is a diagram schematically showing the butterfly match-line structure according to a first embodiment of the present invention.
Figure 2:
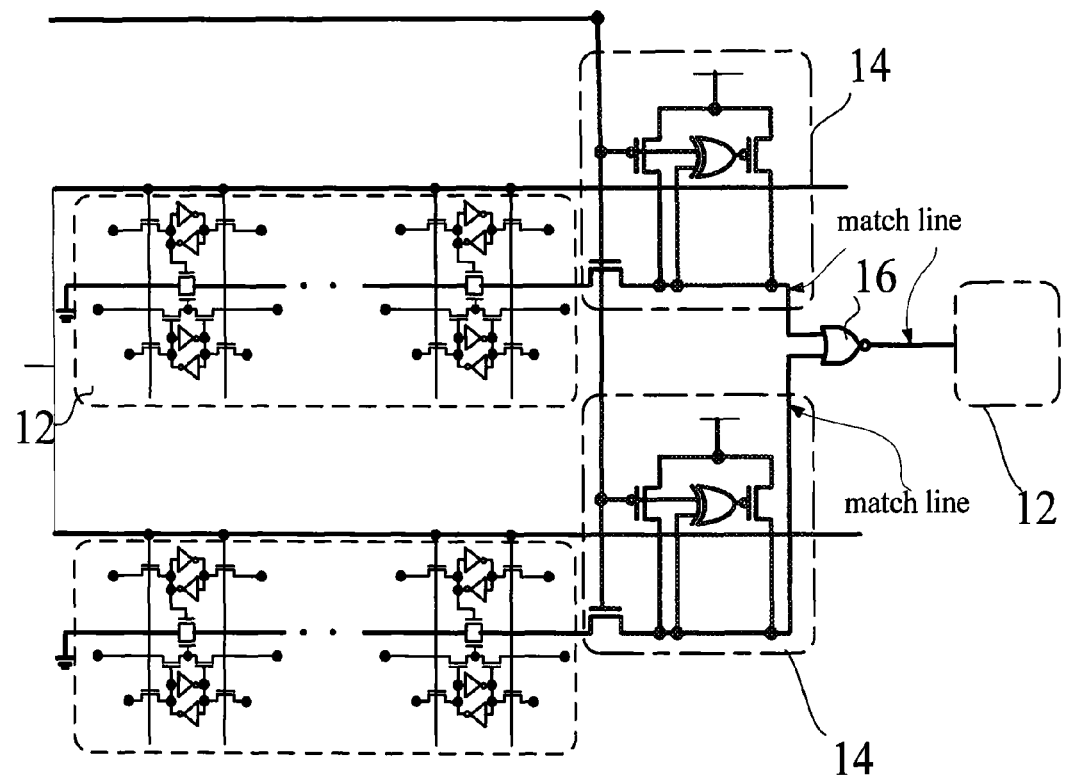
FIG. 2 is a diagram schematically showing the architecture of the circuit of the butterfly match-line structure according to the present invention.

Refer to FIG. 1 and FIG. 2 for a first embodiment of the present invention. The present invention relates to a butterfly match-line structure applying to a content-addressable memory. A plurality of memory cells 12 is allocated from the content-addressable memory, and hierarchical match lines are used to cascade the memory cells 12 with each pair of the diagonally neighboring memory cells 12 of different match lines linked to each other. In such a butterfly match-line structure, the first layer of memory cells 12 is compared against an input signal; if the result is a match case, the next layer of memory cells 12 is compared; if the results are always match cases, comparisons are performed successively until the last layer of memory cells 12; if a miss case occurs in one layer of memory cells 12, the comparing operation stops. The comparing method is exemplified with the first embodiment below.

Figure 1A:
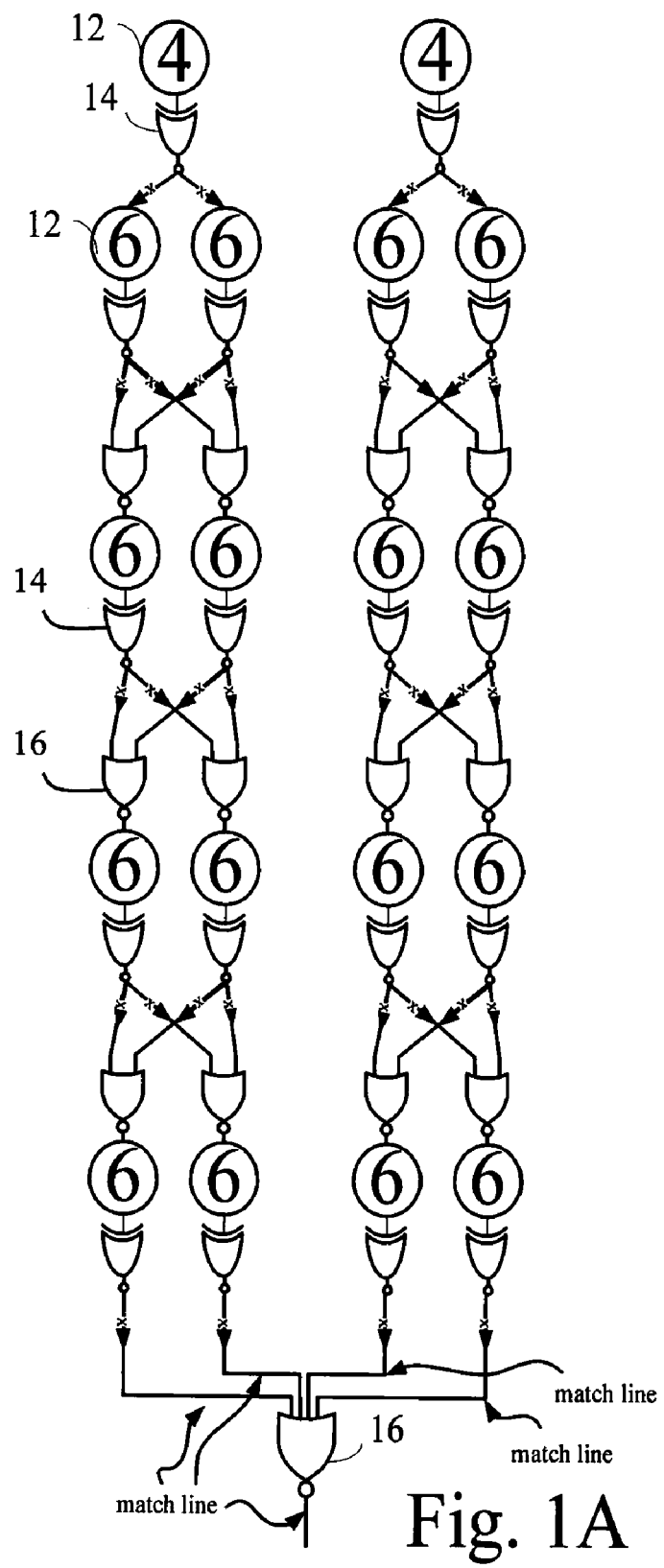
FIG. 1A is a diagram schematically showing the comparing operation performed by the butterfly match-line structure according to a first embodiment of the present invention.

Refer to FIG. 1A. Signals are input to the 4-bit memory cells 12 at both sides for comparisons. If the result is a miss case, the comparing operation stops, and all the 6-bit memory cells 12 are turned off.

Figure 1B:
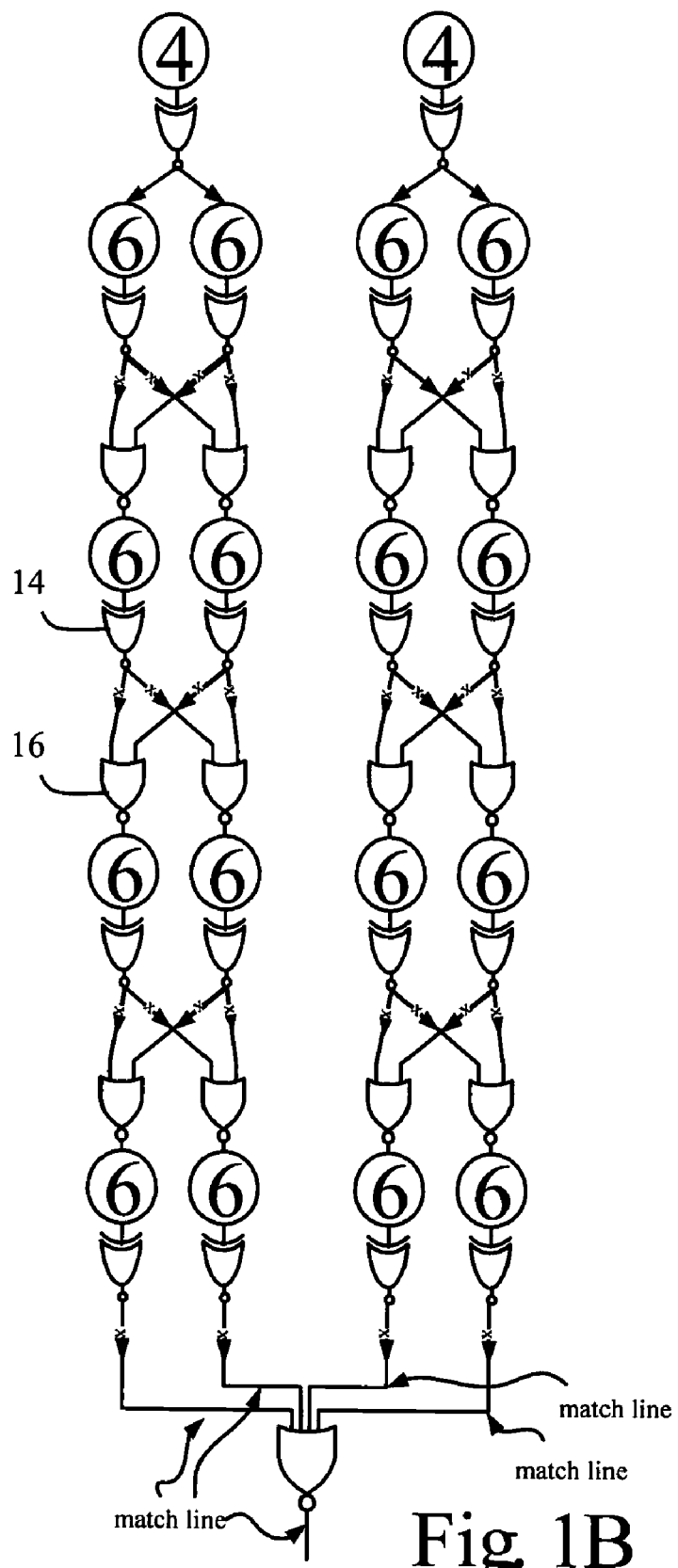
FIG. 1B is another diagram schematically showing the comparing operation performed by the butterfly match-line structure according to a first embodiment of the present invention.

Refer to FIG. 1B. Signals are input to the 4-bit memory cells 12 at both sides for comparisons. If the result is a match case, the next layer of 6-bit memory cells 12 is compared. As shown in FIG. 1B, if the result is a miss case, the information of missing will be crosswise transmitted between different match lines, and the succeeding layers of memory cells 12 will thus be turned off. Therefore, if a miss case occurs in one layer of 6-bit memory cells 12, the comparing operation will stop. Consequently, if the result of a comparison is a miss case, more succeeding memory cells 12 will not be compared but will be turned off. The memory cell 12 may be a 2N-bit one, and N is a positive integer. In other words, the memory cell 12 may be a 4-bit one, a 6-bit one, or an 8-bit one.

In this embodiment, the butterfly match-line structure is partitioned into sixteen 6-bit memory cells 12, and two 4-bit memory cells 12 are respectively allocated to both sides additionally. Such a design will not influence the spirit or claims of the present invention but will provide one more chance of comparison.

Refer to FIG. 2. The output of each hierarchical match line is coupled to a XOR-based conditional keeper 14, and the output of each XOR-based conditional keeper 14 is coupled to an OR-gate inverter 16. The OR-gate inverter 16 receives the information from two memory cells 12 and generates a control signal to determine whether the succeeding memory cells 12 operate. When one of the front-stage memory cells 12 has a miss case, a turn-off signal will be transmitted to all the succeeding memory cells 12. Obviously, the transmission delay, which is originally increased by the butterfly-type connection, is concealed in the XOR-based conditional keeper 14. Via the higher parallelism and the butterfly-type connection, the butterfly match-line structure with the XOR-based conditional keepers 14 can reduce the search time and the power consumption. Further, the XOR-based conditional keeper 14 not only can provide a noise-tolerant function for the dynamic circuit but also can reduce the comparing time and the power consumption at the same time to achieve the best energy efficiency.

In the first embodiment, one match-line set has two match lines, and two ends of the OR-gate inverter 16 respectively connect to two symmetric sets of match lines. From FIG. 1, it can be seen that the match lines of the first embodiment have higher parallelism than the conventional match lines, and the search time of the entire match lines is thus shortened. However, increasing independent parallel match lines will increase power consumption. Therefore, the butterfly-type connection is used in between two parallel match lines, thus, information can be reciprocally transmitted between two originally independent match lines, and the power consumption is reduced. If a miss case occurs in one stage, the information of missing will be passed down to the succeeding memory cells 12, and the succeeding comparing circuit will be turned off to avoid unnecessary power consumption.

Figure 3:
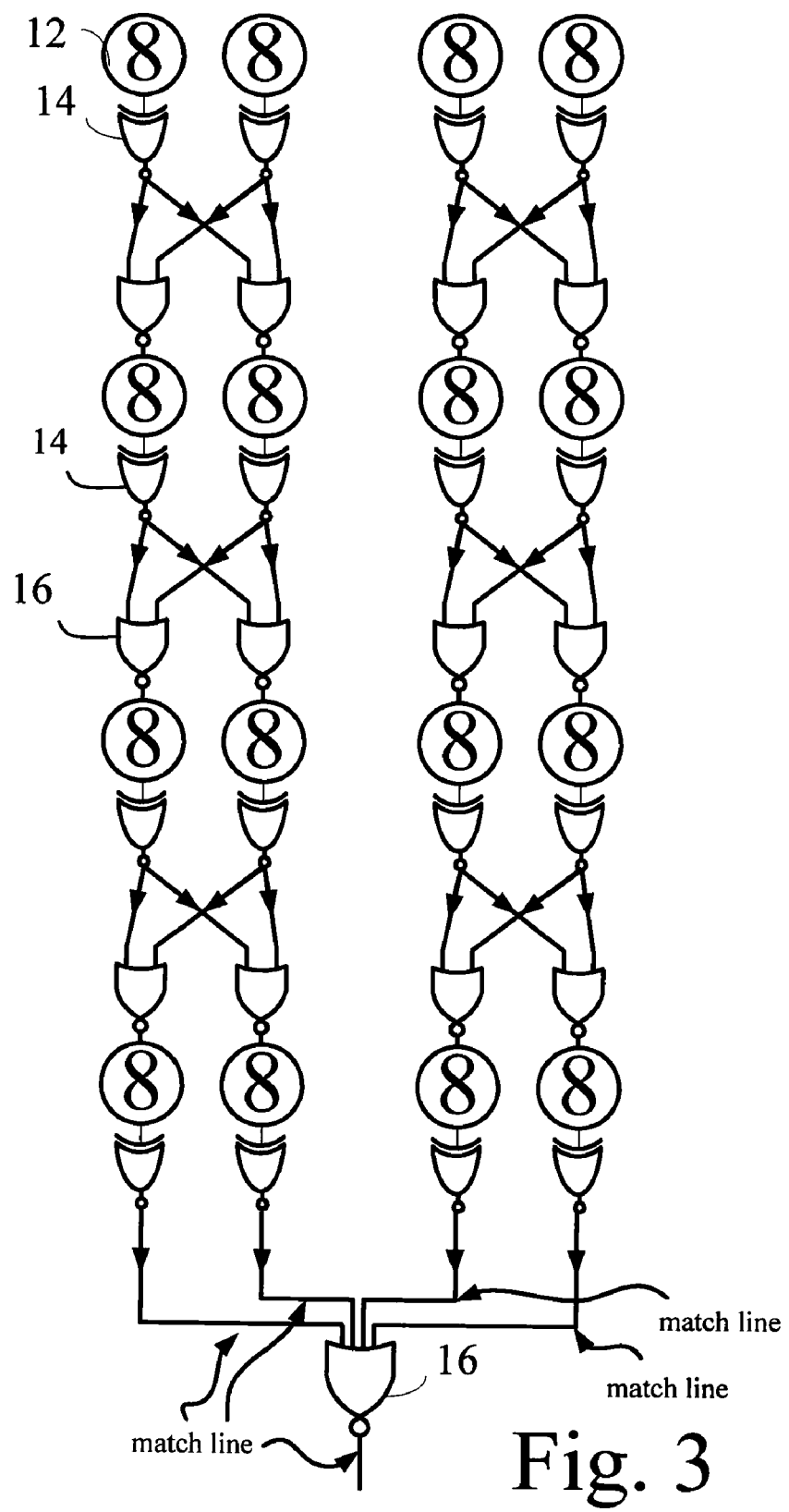
FIG. 3 is a diagram schematically showing the butterfly match-line structure according to a second embodiment of the present invention.

Refer to FIG. 3 for a second embodiment of the present invention. The structure and comparing method of this embodiment are basically similar to those of the first embodiment. In this embodiment, a plurality of memory cells 12 is allocated from the content-addressable memory, and hierarchical match lines are used to cascade the memory cells 12 with each pair of the diagonally neighboring memory cells 12 of different match lines linked to each other. In such a butterfly match-line structure, if a miss case occurs in one layer of the memory cells 12, the comparing operation will stop. Refer to the comparing method of the first embodiment for that of the second embodiment since they are similar to each other.

It is to be noted that this embodiment is different from the first embodiment in that none additional memory cell 12 is allocated to both sides. In the second embodiment, one match-line set has two match lines, and two ends of the OR-gate inverter 16 respectively connect to two symmetric sets of match lines. As shown in FIG. 3, the butterfly match-line structure is partitioned into sixteen 8-bit memory cells 12. The 8-bit input is the high-input logic gate and has a longer delay time. However, a single match line has fewer stages in this embodiment. Thus, the search time of this embodiment is contrarily less than that of the first embodiment.

Figure 4:
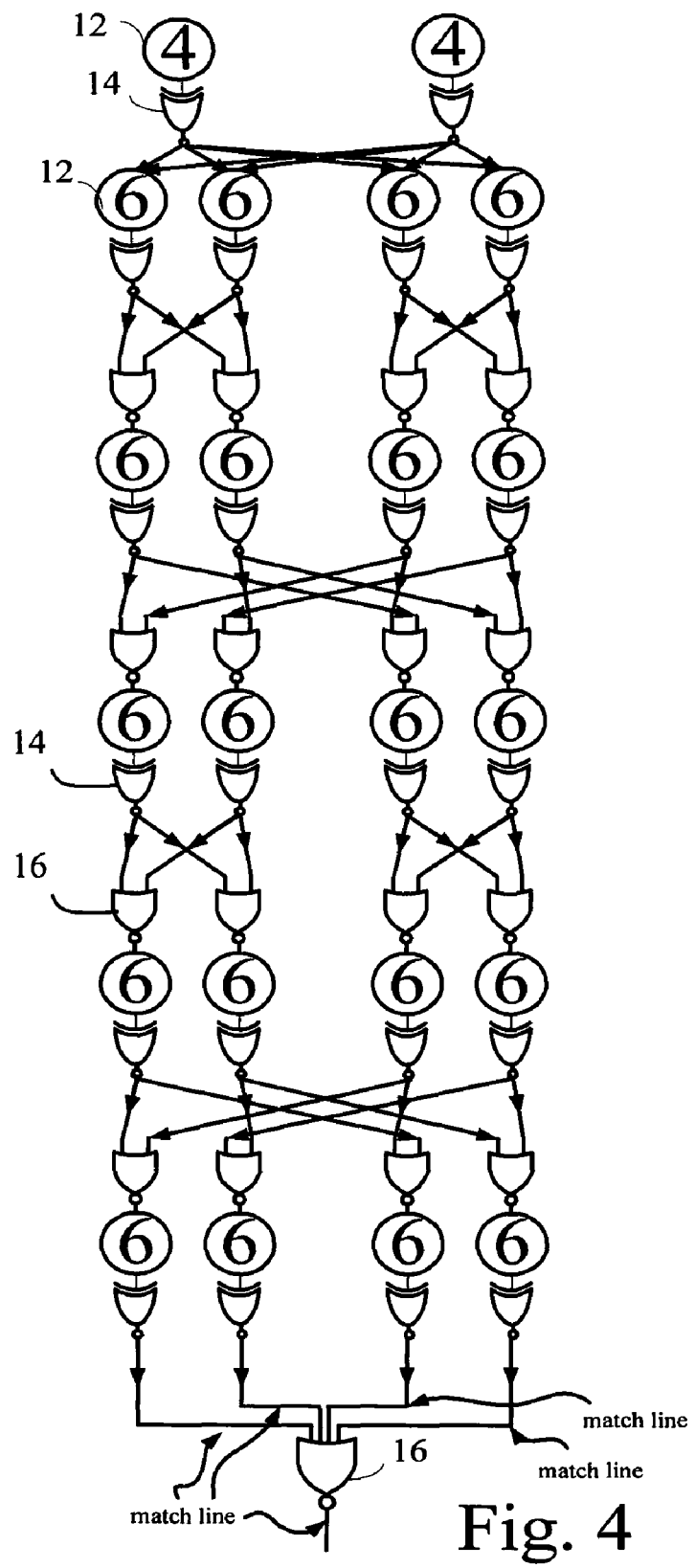
FIG. 4 is a diagram schematically showing the butterfly match-line structure according to a third embodiment of the present invention.

Refer to FIG. 4 for a third embodiment of the present invention. The partition method of this embodiment is basically similar to that of the first embodiment. However, the butterfly-type connection of this embodiment is different from that of the first embodiment. In this embodiment, the memory cells 12 interconnect as follows:

In the first and second layers, the diagonally-neighboring memory cells 12 of the first and second match lines are linked to each other, and the diagonally-neighboring memory cells 12 of the third and fourth match lines are linked to each other; in the second and third layers, the diagonally-neighboring memory cells 12 of the first and third match lines are linked to each other, and the diagonally-neighboring memory cells 12 of the second and fourth match lines are linked to each other; the cycle of the first and second layers plus the second and third layers is repeated in the succeeding layers until the last layer of memory cells 12 is coupled to the XOR-based conditional keepers 14.

In the third embodiment, the four parallel match lines have more associativity, and the connection of the four match lines is also more complicated. The critical delay time of the first and third embodiments is reduced from grade 11 to grade 4, and the critical delay time of the first embodiment is reduced from grade 11 to grade 4. The first embodiment has a simpler circuit layout and routing, and the second embodiment has a shorter search time, and the third embodiment has higher energy efficiency.

Figure 5:
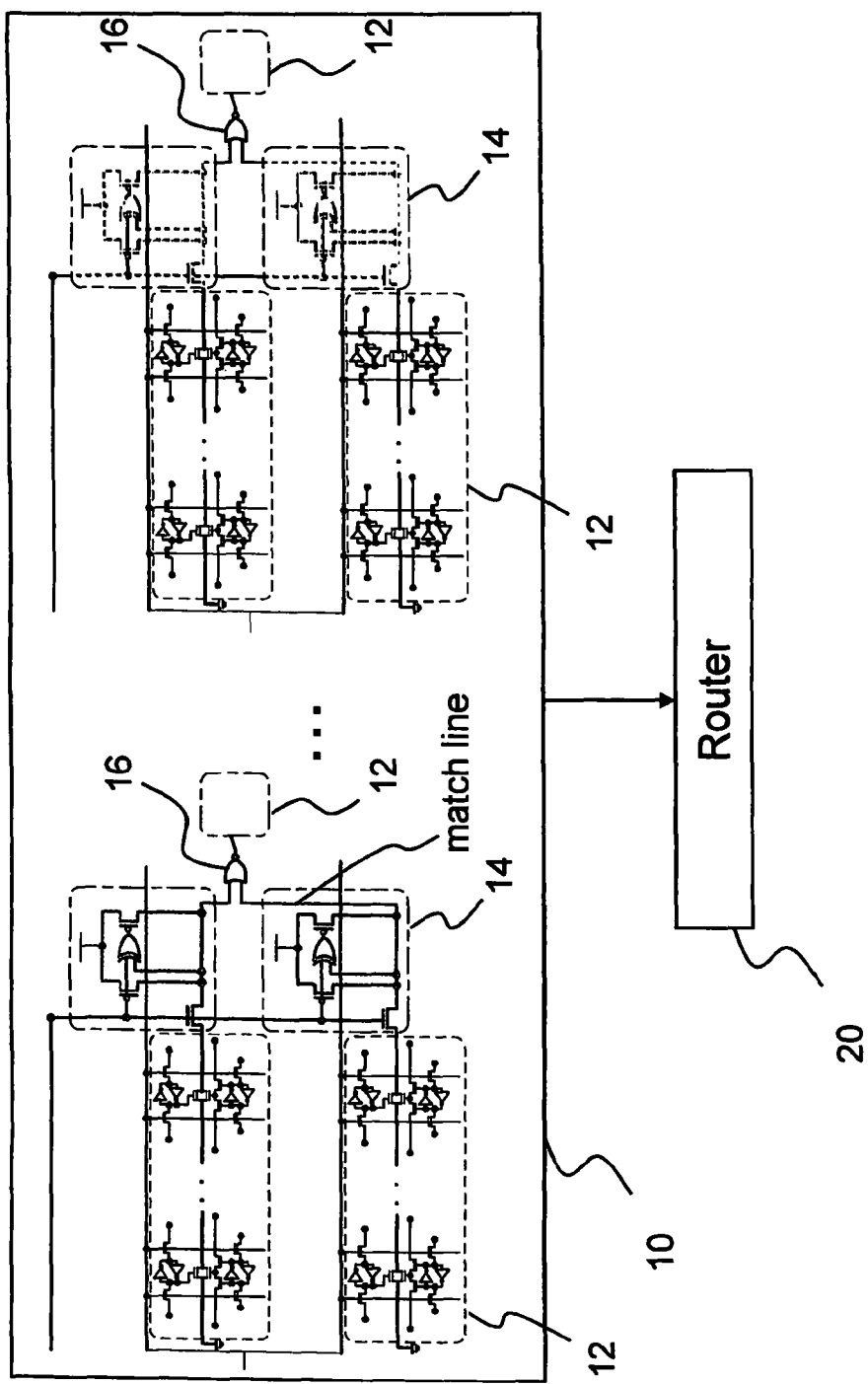
FIG. 5 is a diagram schematically showing the butterfly match-line structure used with a router.

FIG. 5 shows the butterfly match-line structure 10 used with a router 20.

In summary, the present invention has the following advantages:

1. The butterfly match-line structure proposed by the present invention can reduces the search time and power consumption at the same time;
2. The butterfly match-line structure of the present invention utilizes the butterfly-type connection to link different match lines; as the control signals are obtained from the front stages, not too many logic gates need to be added;
3. The XOR-based conditional keepers used in the present invention can reduce the delay time of the butterfly-type connection and achieve the best energy efficiency;

4. The XOR-based conditional keeper itself can provide a noise-tolerant function for the dynamic circuit and can also eliminate unnecessary power consumption.

Those described above are the preferred embodiments to exemplify the present invention. However, it is not intended to limit the scope of the present invention. Any equivalent modification or variation according to the shapes, structures, characteristics and spirit of the present invention is to be also included within the scope of the claims of the present invention.

What is claimed is:

1. A butterfly match-line structure, applying to a content-addressable memory, comprising:
    a plurality of memory cells allocated from said content-addressable memory;
    at least one set of hierarchical match lines cascading said memory cells, wherein each pair of the diagonally-neighboring memory cells of hierarchical match lines is linked to each other, and further wherein said butterfly match-line structure comparing operation stops once an input signal does not match one layer of said memory cells;
    at least one XOR-based conditional keeper coupled to one of the hierarchical match line, wherein the at least one XOR-based conditional keeper provides a noise-tolerant function for a dynamic circuit and reduces search time and power consumption at the same time; and
    an OR-gate inverter coupled to an output of said at least one XOR-based conditional keeper.

2. The butterfly match-line structure according to claim 1, which can apply to a router.

3. The butterfly match-line structure according to claim 1, wherein one of said memory cells has 2N bits, and N is a positive integer.

4. The butterfly match-line structure according to claim 3, wherein one of said memory cells has 4 bits, 6 bits, or 8 bits.

5. The butterfly match-line structure according to claim 1, wherein when said at least one set of hierarchical match lines has four match lines, said memory cells interconnect as follows:
    in first and second layers, said diagonally-neighboring memory cells of the first and second match lines are linked to each other, and in third and fourth layers, said diagonally-neighboring memory cells of third and fourth match lines are linked to each other; in said second and said third layers, said diagonally-neighboring memory cells of said first and said third match lines are linked to each other, and said diagonally-neighboring memory cells of said second and said fourth match lines are linked to each other; a cycle of said first and said second layers plus said second and said third layers are repeated in succeeding layers until a last layer of said memory cells is coupled to said XOR-based conditional keepers.

6. A search method implemented by a butterfly match-line structure, applying to a content-addressable memory and comprising the following steps:
    allocating a plurality of memory cells from said content-addressable memory;
    utilizing at least one set of hierarchical match lines to cascade said memory cells with each pair of the diagonally-neighboring said memory cells of different said match lines linked to each other, wherein an output of said hierarchical match lines is coupled to an XOR-based conditional keeper, which not only provides a noise-tolerant function for a dynamic circuit but also reduces search time and power consumption at the same time to achieve best energy efficiency, and an OR-gate inverter coupled to an output of said XOR-based conditional keeper;
    comparing one of said memory cells against an input signal; if a result is a match case, comparing a succeeding memory cell of said memory cell against said input signal; if the results are always match cases, performing comparisons successively until a last one of said memory cells; and
    stopping the comparison operation if a miss case occurs by turning off succeeding memory cells; and
    each of said memory cells has 2N bits, and N is a positive integer.

7. The search method implemented by a butterfly match-line structure according to claim 6, which can apply to a router.

8. The search method implemented by a butterfly match-line structure according to claim 6, wherein one of said memory cells has 4 bits, 6 bits, or 8 bits.

9. The search method implemented by a butterfly match-line structure according to claim 6, wherein the output of said XOR-based conditional keeper is coupled to an OR-gate inverter.

10. A butterfly match-line structure, comprising:
    a plurality of memory cells allocated from a content-addressable memory;
    a plurality of match lines coupling the plurality of memory cells in a cascade structure, wherein the cascade structure comprises a plurality of sets of memory cells, each set comprising at least two parallel memory cells and at least two crossing match lines, further wherein crossing match lines connect different sets of diagonally offset memory cells;
    a plurality of XOR-based conditional keepers, connected to the plurality of memory cells respectively and receiving outputs of the plurality of the memory cells; and
    at least one OR-gate inverter, having at least two inputs, the at least two inputs receiving outputs from at least two different XOR-based conditional keepers.

11. The butterfly match-line structure according to claim 10, wherein the at least one OR-gate inverter generates a control signal according to the outputs from at least two different XOR-based conditional keepers, wherein each of the at least two different XOR-based conditional keepers is connected to a memory cell within a same set, and further wherein the control signal causes the memory cells at a succeeding set to turn off when a missed match occurs at a preceding set.

* * * * *